United States Patent [19]

Kershner et al.

[11] Patent Number: 4,859,854
[45] Date of Patent: Aug. 22, 1989

[54] OPEN GRID PULSED ION CHAMBER OPERATING IN THE LINEAR ION COLLECTION REGION

[75] Inventors: Carl J. Kershner, Dayton; Edward T. Burgess, Carlisle, both of Ohio

[73] Assignee: Femto-Tech, Inc., Carlisle, Ohio

[21] Appl. No.: 197,496

[22] Filed: Aug. 15, 1988

Related U.S. Application Data

[62] Division of Ser. No. 39,392, Apr. 16, 1987.

[51] Int. Cl.$^4$ ............................................. H01J 47/02
[52] U.S. Cl. .................................. 250/374; 250/387; 250/388
[58] Field of Search ............... 250/374, 379, 380, 386, 250/388, 389

[56] References Cited

U.S. PATENT DOCUMENTS

| | | | |
|---|---|---|---|
| 2,499,830 | 3/1950 | Molloy | 250/388 |
| 3,408,571 | 10/1968 | Wilson | 455/110 |
| 3,603,831 | 9/1971 | Kimmel | 313/93 |
| 4,262,203 | 4/1981 | Overhoff | 250/374 |
| 4,288,694 | 9/1981 | Ahrons | 250/374 |
| 4,755,682 | 7/1988 | Burgess | 250/374 |

OTHER PUBLICATIONS

Roland A. Jalbert, "A Monitor for Tritium in Air Containing Other Beta Emitters," *Proceedings of 23rd Conference on Remote Systems Technology*, San Francisco, California, (Nov. 17-20, 1975), pp. 89-93.

Greinacher, H., "Registering of α- and H-Rays According to the New Electrical Counting Method," *Z. Physik*, 44, 319-325 (1927) [as reported in 21 *Chemical Abstracts* 3544].

Wilkinson, D. H., *Ionization Chambers and Counters*, Cambridge, University Press, 1950, pp. 104-113.

Price, William J., *Nuclear Radiation Detection*, New York, McGraw-Hill Book Company, Inc., 1958, pp. 67, 75, 101-106 and 358-359.

*Primary Examiner*—Constantine Hannaher
*Attorney, Agent, or Firm*—Biebel, French & Nauman

[57] ABSTRACT

A detector for airborne alpha radiation includes a ion pulse collecting chamber connected to a phase shifted, 100% negative feedback electrometer circuit. The ion pulse chamber includes a probe surrounded by an 80% open grid, with the spacing between the probe and the grid providing no greater than about 50 ms transit time before collection and having a capacitance of less than 1 pf. The field strength between the probe and the grid is less than 10 V/cm. The ion pulse chamber is contained within a vented cabinet. If it is desired to count only radon, a negative potential with respect to the grid may be applied to the cabinet to collect positively charged free ions. Alternatively, the cabinet wall can be made positive with respect to the grid to create a potential-well at or near the grid to provide an enhanced daughter detection mode. If the cabinet wall and the grid are the same potential, both radon and daughter alpha radiation are detected.

12 Claims, 2 Drawing Sheets

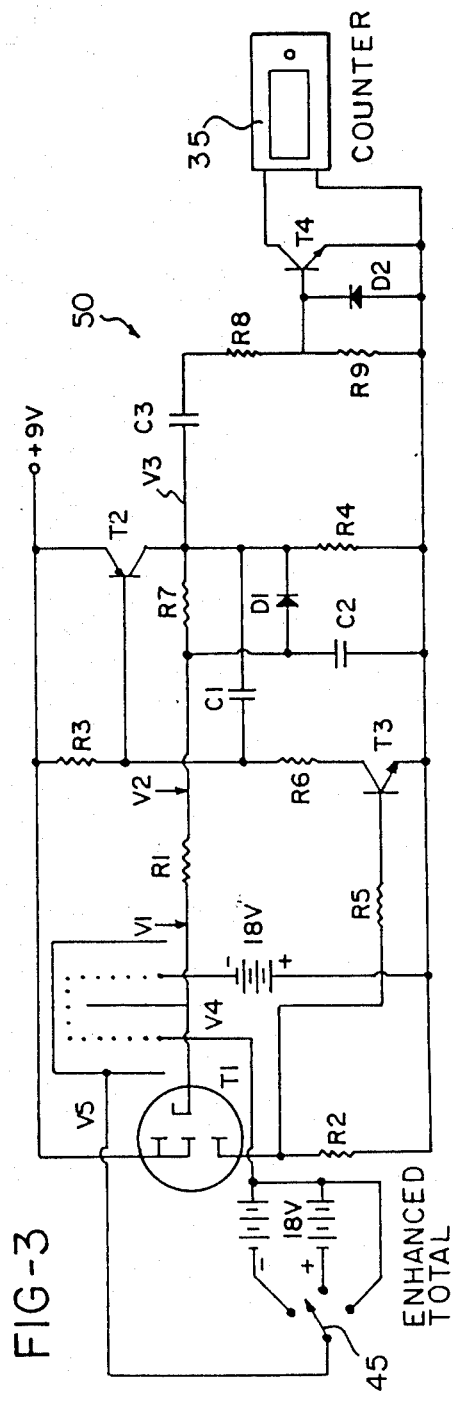
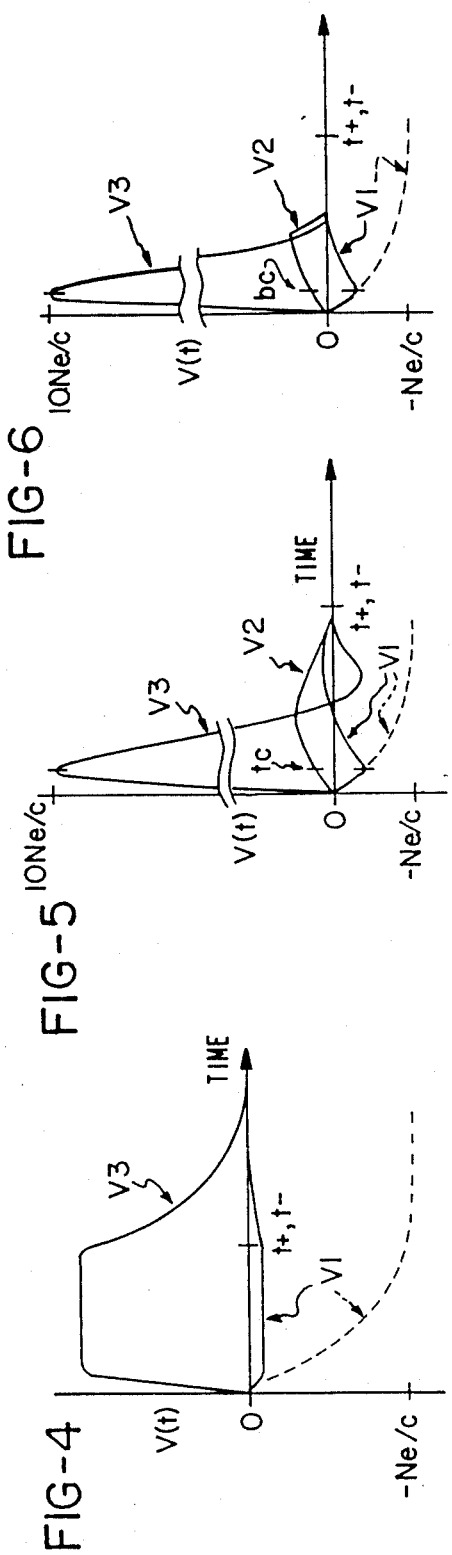

OPEN GRID PULSED ION CHAMBER OPERATING IN THE LINEAR ION COLLECTION REGION

This is a division of application Ser. No. 039,392, filed Apr. 16, 1987.

BACKGROUND OF THE INVENTION

In the past several years, there has been increasing concern over the health hazard of exposure to radon-222, a radioactive gas produced in the uranium-238 natural decay series. This is in part due to an improved understanding of the radiobiological effects of radon, but more importantly to the recognition of an exposure hazard to the general population. The exposure hazard to uranium miners and mill employees has been recognized for many years, but it has only been recently that radon-222 and its radioactive progeny have been found to pose a potential health hazard in private dwellings. This is in part due to energy conservation measures that lead to nearly airtight structures with little outside air exchange. Radon levels can build up in these closed structures by diffusion from underlying rock and soil through cracks and pores in concrete floors and concrete block foundation walls. Because radon is a gas and its decay products are generally found as suspended particulates, human exposure is primarily through inhalation. Fractions of these radioactive species are retained in the lungs and have the potential of producing lung cancer.

Present monitoring techniques used for radon detection are either of the continuous type which provide activity flux level information on a "real-time" basis or of the integrating type which provide dose information for a selected time period. Present continuous type monitors are generally based on gas proportional or scintillation techniques and are sophisticated instruments more suited to the laboratory than for field or private home applications. The most commonly used integrating type monitors use thermoluminescence detectors (TLD) or solid state nuclear track detectors (SSNTD) which are inexpensive passive devices, but only give integrated dose information for periods of from days to months. Because radon levels can vary an order-of-magnitude over a twenty-four hour period, a home owner needs to have continuous monitoring in order to provide economical heating and air conditioning and at the same time control radon levels. Moreover, a radon source tracking, ventilation control, or remedial action analysis can only be accurately carried out with continuous type detectors. Thus, there is a need for portable, low cost, low power, continuous detection instrumentation for monitoring airborne alpha radiation.

The use of ionization chambers as a means of detecting nuclear radiation is an adaptation of a very old art, going back to nineteenth-century work on conduction in gases. The passage through a gas of alpha radiation of MeV energies produce, through ionization, approximately $10^{-14}$ coulomb of charges before coming to rest. It is upon this effect that the class of detection instruments called ionization chambers are based. The ion pairs produced are collected through the use of an electrostatic field gradient imposed on the ionizing volume. If the field gradient is great enough to result in collection at an electrode before recombination, but insufficient to cause secondary collision ionization, the chamber is said to be operating in the ion or linear region. The linear region generally exists below approximately 100 V/cm. If the field gradient is between 100 and 1000 V/cm, the chamber is said to be operating in the gas proportional region where a controlled "gain" in charge carriers is produced through collision ionization processes. At field gradients greater than approximately 1000 V/cm, the "Geiger" region is reached where every primary ionization results in an avalanche discharge within the chamber.

The Geiger type counter is not suited for airborne radon detection because its sealed-tube design precludes unobstructed sampling of the alpha radiation. Gas proportional type counters are used for radon measurements, but because this type of counter operates with low electron attachment sample gas and high field gradients, it requires costly and high energy consuming power supplies, pumps and sample gas processing equipment for its flow-through chamber.

Ion or electron chamber counters operating in the linear or non-multiplication mode possess the requisite low voltage and current characteristics and are both simple in design and can provide real-time information. They can also be operated in either the current or pulsed mode. However, when operated in the current mode, both the ion and electron chamber suffer from base-line drift and do not discriminate between different radiations. Moreover, current mode ion and electron chambers are highly sensitive to charged particles, such as smoke, and thus require special pre-filtration of sample gases. The electron pulse, sometimes referred to as the fast-pulse mode, can only be applied in low electron attachment gas environments where electrons survive long enough to be collected and counted. This precludes the use of the electron pulse technique in normal air environments due to the high electron attachment coefficient of oxygen and water vapor. The ion pulse or slow-pulse mode is possible in air environments, but because ion mobilities are nominally a thousand times smaller than electron mobilities, the pulses are long (>100 ms), irregularly shaped and poorly suited for electronic counting. Thus, although the first pulse chambers used to detect alpha radiation in air were of the ion pulse type (Greinacher 1927), the fast-pulse type is employed almost exclusively in commercial instruments. Overhoff (U.S. Pat. No. 4,262,203) describes a slow-pulse type alpha monitor, but because the concept is based on a flow-through chamber, relatively large volumes are required for measurements in low level environmental samples. The one liter chamber used by Overhoff requires a high electrostatic potential of 500 volts to maintain field gradients sufficient to overcome ion recombination. Moreover, a multi-staged pulse recognition, shaping and amplification circuit is required to produce countable output pulses. Thus, this approach has the same hig power consumption and cost disadvantages as fast-pulse gas proportional counting.

SUMMARY OF THE INVENTION

It is the object of this invention to provide a small portable instrument for selectively detecting airborne alpha radiation in a "real-time" mode directly in an air environment based on an ion pulse collection and counting technique.

It is a further object to provide a probe type ion chamber design with sufficient active sample volume to detect environmental concentration levels (0.1 pCi/l) of airborne radon radiation while requiring less than 30 volt electrostatic potentials between the collecting electrodes.

It is a further object to provide a means of producing directly within the electrometer stage, amplified ion pulses suitably shaped and narrowed (fast rise and short decay with a full width at half maximum of between 10 and 25 ms) for electronic counting. Thus, eliminating the need for separate power consuming delay, comparator, and correlation stages.

Another objective is to provide an ion chamber design capable of selectively sampling either radon alpha activity or the total alpha activity in a gas mixture containing both radon and its alpha emitting daughters. This is a particularly desirable feature because radiobiological efficacy is greater for the alpha emitting daughters polonium-218 and polonium-214 than it is for radon-222 and knowledge of the relative concentrations is required for accurate hazard assessment.

These objectives have been accomplished in this invention through the unique combination of a phase shifted, negative feedback, field effect transistor (FET) electrometer with an ultra, low capacitance, open grid chamber design. The electrode spacing and chamber volume are optimized to provide short ion travel while maintaining a relatively large sampling volume. Moreover, because this technique works at low field strengths (<10 V/cm) and accomplishes pulse shaping and amplification directly within the electrometer, low voltage, portable power supplies are possible (<15 microamperes at 18 V).

Discrimination between radon and its alpha emitting daughters is accomplished by biasing the monitor cabinet negative with respect to the grid electrode. Because the daughters are found in air as either positively charged free ions or particulates, they are swept from the sensing volume and collected on the cabinet wall and only radon alpha radiation is detected.

An enhanced daughter detection mode is obtained if the cabinet wall is biased positive with respect to the grid. In this mode, an electrostatic potential-well is established around the outside of the grid which attracts and holds positively charged daughter particles and ions at a favorable distance for detecting their emitted alpha radiation.

If the cabinet wall and the grid electrode are at the same potential, both radon and daughter alpha radiation are detected. Best separations are accomplished if the distance between the grid electrode and the cabinet wall is at least one alpha range for the highest energy alpha, polonium-214. This distance is found to be at least 7 cm—the distance required to stop a polonium-214 alpha particle in air.

Other objects and advantages of the invention will be apparent from the following description, the accompanying drawings and the appended claims.

BRIEF DESCRIPTION OF THE DRAWINGS

FIG. 3 is an electrical schematic diagram of a phase shifted feedback electrometer circuit.

FIG. 4 is a waveform diagram showing the operation of a 100% negative feedback electrometer.

FIG. 5 is a waveform diagram showing the effect of phase shifting, or delayed application of the negative feedback.

FIG. 6 is a waveform diagram showing a phase shifted negative feedback circuit with diode clamping.

DESCRIPTION OF THE PREFERRED EMBODIMENT

Figure 1:
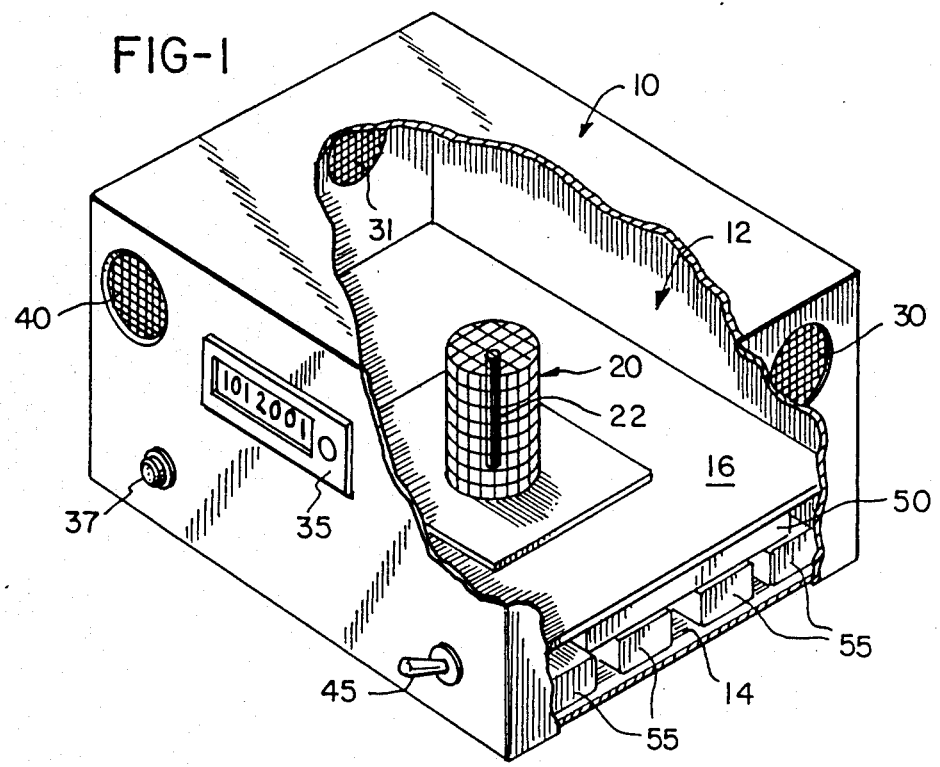
FIG. 1 is a perspective view, partly broken away, of a monitor for airborne alpha radiation constructed according to this invention.

Referring now to the drawings which illustrate a preferred embodiment of the invention, the monitor shown in FIG. 1 is housed in a 6"H×10"W×7"D (15 cm H×25 cm W×18 cm D) metal instrument cabinet 10 with a horizontal divider 12 separating a lower electronic compartment 14 from an upper ion chamber enclosure 16. The metal cabinet serves as an electromagnetic radiation shield for a sensitive ion probe 20, but has screened openings 30 and 31 for allowing free flow of air to the probe 20.

The exterior of the cabinet 10 is also provided with a commercially available six digit LCD counter and display device 35, a battery test button 37, a battery test beeper 40 for indicating when new batteries are needed, and a radon/enhanced/total alpha switch 45. The interior of the cabinet 10 includes an electrometer package 50 (shown in FIG. 3) and a plurality of batteries 55.

Figure 2:
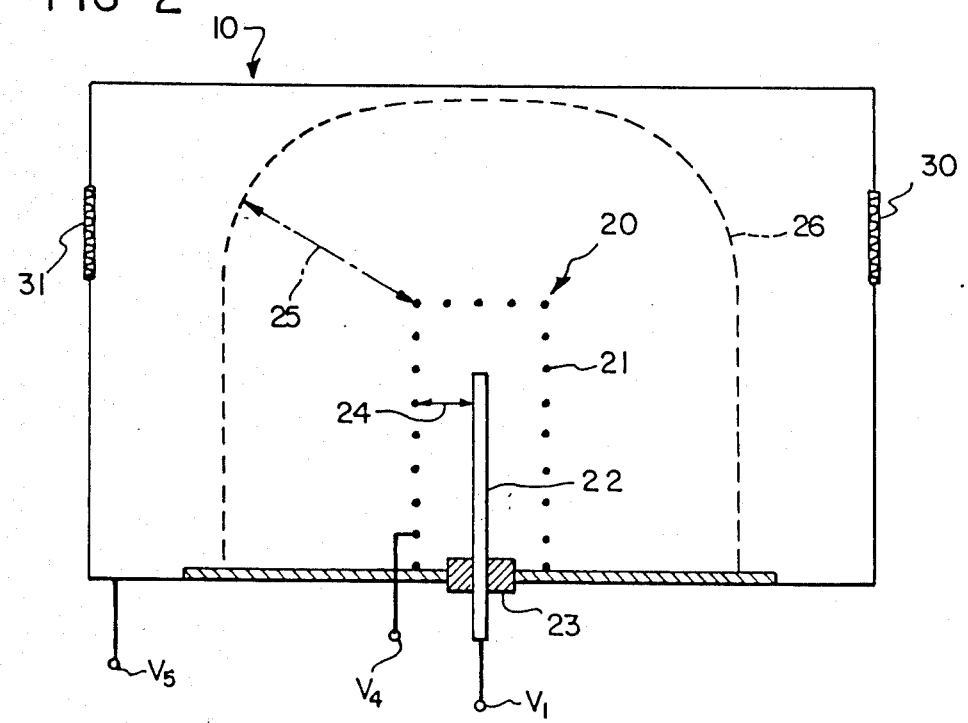
FIG. 2 is an elevational view of an ion pulse collecting chamber.

As shown in FIG. 2, the ion pulse collecting chamber or probe 20 includes a highly open grid cylindrical wall 21 which serves as one electrode, a center rod 22 which serves as the other electrode of the ion collection chamber and a high resistance insulator 23. The unique features of this chamber are: (1) the electrode spacing 24 is set, according to the field used, so that any in created within the chamber will have no greater than 50 msec transit time before being collected, and (2) the open grid reduces the chamber capacitance and at the same time increases the effective chamber volume by counting a portion of the alpha particles that originate within one alpha range distance 25 outside the chamber wall 21. The effective chamber boundary is defined in FIG. 2 by the dashed line 26.

A typical coaxial cylindrical chamber of one inch diameter and two inches long with an 80% open area outer wall has a capacitance of less than 1 pf and results in a calibration factor of 0.3 cpm per pCi/1 radon-222. Although this chamber only has a geometrical volume of 26 cm$^3$, its effective volume for radon-222, polonium-218 and polonium-214 are 82, 95 and 141 cm$^3$, respectively.

In its simplest configuration, the electrometer circuit shown in FIG. 3 is comprised of a high power gain (typically 10$^9$) field effect transistor T1, an input resistor R1, high gain transistors T2 and T3 and biasing/load resistors R2, R3 and R4. This type of one hundred percent negative feedback has been employed since the time of vacuum-tube electrometers to improve linearity and stability.

Even more important to the present application, however, is the reduction in the effective capacitance of the input through the relationship $C_{eff}=C/(1+G)$, where G is the current gain of the feedback amplifier and C is the actual capacitance of the input. Thus, with typical feedback circuit gains of 10$^5$, the input capacitance becomes insignificant. Because the voltage gain of this type of circuit is essentially unity and the pulse width is dependent on the time-of-flight of the ions, further amplification and pulse shaping is required before the signals are suitable for nuclear counting.

The present invention overcomes these difficulties, especially limiting in portable applications demanding low power drain, through the use of a phase shifted feedback technique. Circuit elements C2, R7 and D1 provide the RC network to produce this phase shift function. The remainder of the circuit elements, R8, R9, C3, D2 and T4, provide a transistor switch for incrementing a commercially available large scale integrated circuit (LSI) counter 35 with liquid crystal display (LCD).

The differences between a conventional negative feedback electrometer and the phase shifted feedback electrometer, as well as the operating principles of the latter, can be seen by examining FIGS. 4, 5 and 6. The dotted curve in FIG. 4 represents the voltage-time relationship for an ion chamber electrometer with no feedback and an input RC time constant much greater than the collection times of the positive and negative ions, $t+$ and $t-$, respectively. The solid curves in FIG. 4 represent the collection electrode voltage, V1, and output voltage, V3, for the same ion chamber and load resistor as above, but with a high percent of negative feedback. It is seen that the output pulse rather faithfully follows the time-of-flight collection time of the ions. However, with practical chamber capacitances ($>1$ pf) and input resistor values ($<10^{12}$ ohms), output pulse heights and widths are in the millivolt and 50 to 100 msec range, respectively. Therefore, further pulse shaping and amplification must be carried out before these signals are suitable for input to a nuclear counter.

The negative going pulse for V1 in FIG. 4 is due to circuit non-idealities such as FET gate capacitance, gate-to-drain leakage current, and a collection of other control current losses around the feedback circuit. The greater this negative voltage, the lower the feedback and the longer the signal pulse tail. To hold this control voltage to a minimum, the FET, load resistor and other components of the feedback circuit must be designed with ultra-low capacitances and current leakage. By phase shifting the feedback, all the above enumerated problems are either eliminated or greatly reduced and the output signal pulse is of sufficient amplitude and narrowed width to directly drive a nuclear counter.

The principles of the phase shifted feedback can be understood by examining FIG. 5. The voltage at the collecting electrode, V1, the intermediate phase shifted voltage, V2, and the output voltage, V3, are all shown as functions of time. As in FIG. 4, the dotted curve 11 represents the voltage on the collection electrode of the same chamber without feedback. With phase shifted feedback, however, V1 increases negatively along the non-feedback curve until a "control point" is reached at time, $t_c$. At this time, the voltage drop across R1 is sufficient to maintain a current through R1 equal to the ion collection current. At $t_c$, the output voltage, V3, peaks and starts down while V2 continues to rise until V2 equals V3, and then V2 falls off also.

If no damping is provided, the signals will "ring", as shown in FIG. 5. A diode, D1, is thus placed across R7 to clamp the circuit and minimize the undershoot of V3, as illustrated in FIG. 6. This clamping of the tail of the pulse rearms the electrometer to be ready to accept another pulse so that dead time is reduced. The circuit must be "tuned" so that the time constant, (R7×C2), is large enough to give the desired amplification of V3, but small enough to operate within the ion collection times, $t+$ and $t-$.

The feedback phase shift circuit has the effect of amplifying the output pulse by leading edge overshoot and results in an increase in the output of more than an order-of-magnitude in signal-to-noise. The phase shifted feedback circuit tends to discriminate against all noise frequencies with rate of rise times different from the ion pulses the circuit was designed for. Additional high frequency filtering is provided by the filter network formed by R6 and C1. The following values are typical for these components and lead to output pulses of over 200 mV from the unphase shifted and over 1.5 V from phase shifted circuits, when counting 5 MeV alpha particles.

| | |
|---|---|
| R1 | $10^{11}$ ohm |
| R2 | 1 meg ohm |
| R3 | 120 K ohm |
| R4 | 1 meg ohm |
| R5 | 10 K ohm |
| R6 | 220 K ohm |
| R7 | 470 K ohm |
| R8 | 100 K ohm |
| R9 | 330 K ohm |
| T1 | MFE 823 |
| T2 | MPS 6534 |
| T3 | MPS 6531 |
| T4 | MPS 6531 |
| C1 | 0.001 mfd |
| C2 | 0.1 mfd |
| C3 | 0.1 mfd |
| D1 | IN34 |
| D2 | IN914 |
| B1, B2 | 18 V Battery |

The circuit shown in FIG. 3, without the phase shifted feedback, has a signal-to-noise ratio of approximately 20 whereas the phase shifted version, as shown, has a signal-to-noise of over 200. Because pulse widths are narrowed to approximately 10 msec with the phase shifted feedback circuit, pulse pile-up is not a problem for count rates below 50 counts per second.

The combination of the small, low capacitance, open grid chamber with the phase shifted feedback electrometer leads to an ion pulse detector capable of operating in an air environment, drawing only micro amperes of current and easily capable of detecting environmental levels (approximately 0.1 pCi/l) of radon and/or its daughters With batteries installed, the monitor weighs less than five pounds and can easily be carried by a handle on top of the cabinet. This counter module is self-contained and operates for up to four years on two 1.5 V alkaline "N" cells. The remainder of the power requirements are supplied by readily and conveniently obtainable 9 V transistor radio batteries housed in the lower compartment of the monitor enclosure. Because the electrometer draws less than 15 μA current, a standard carbon zinc battery gives over two years of continuous operation—alkaline or other greater capacity batteries will provide commensurately longer service. Because there is essentially no current drain on the biasing batteries, their service life in this application is essentially the shelf-life of the battery.

.While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A device for detecting airborne alpha radiation in real time, said device including
   an ion pulse collecting chamber comprising a probe, and an open grid surrounding said probe,
   electrometer means connected between the probe and said grid, said electrometer means having a power gain of approximately $10^9$ or more, and including pulse shaping means, and
   counter means for counting the number of pulses detected by said ion pulse collecting chamber.

2. The device of claim 1 wherein the spacing between the probe and the grid provide no greater than a 50 msec transit time before collection of an ion created in said chamber.

3. The device of claim 1 wherein said ion pulse collecting chamber has a capacitance of less than 1 pf.

4. The device of claim 1 wherein the grid of said ion pulse collecting chamber is 80% open.

5. The device of claim 1 wherein said electrometer means includes
   an FET having a low capacitance input and an output,
   feedback circuit means connected between the input and output of said FET for providing a negative feedback voltage to said input of nearly 100%, and
   phase shift circuit means in said feedback circuit means for delaying momentarily the application of said feedback voltage, thereby to allow the output of said FET to have a momentary power gain of sufficient magnitude and pulse width to drive an external counter circuit.

6. The device of claim 1 further including a cabinet surrounding said ion pulse chamber and means for applying a negative potential to the cabinet with respect to the open grid, thereby to collect positively charged free ions or particulates on said cabinet wall.

7. The device of claim 1 further including a cabinet surrounding said ion pulse chamber and means for applying a positive potential to the cabinet with respect to the grid, thereby collecting positively charged free ions or particulates at or near said grid to enhance detection of positively charged radioactive species.

8. The device of claim 1 further including means for applying an electrostatic potential between said probe and said grid in the order or less than 10 V/cm thereby to operate said chamber in the linear ion collection region.

9. A device for detecting airborne alpha radiation in real time, said device including
   an ion pulse collecting chamber comprising a probe, and an open grid surrounding said probe, said grid being 80% open, the spacing between the probe and the grid providing no greater than a 50 msec transit time before collection, and having a capacitance of less than 1 pf,
   electrometer means connected between the probe and said grid, said electrometer means having nearly 100% negative feedback and a power gain of approximately $10^9$ or more, and
   counter means connected to said electrometer means for counting the number of pulses detected by said ion pulse collecting chamber.

10. A device for detecting airborne alpha radiation in real time, said device including
    an ion pulse collecting chamber comprising a probe, and an open grid surrounding said probe, said grid being 80% open, the spacing between the probe and the grid providing no greater than a 50 msec transit time before collection of ions created within said chamber, and having a capacitance of less than 1 pf,
    electrometer means connected between the probe and said grid, said electrometer means including an FET having a low capacitance input and an output, feedback circuit means connected between the input and output of said FET for providing a negative feedback voltage to said input of nearly 100%, and phase shift circuit means in said feedback circuit means for delaying momentarily the application of said feedback voltage, thereby to allow the output of said FET to have a momentary power gain of sufficient magnitude and pulse width to drive an external counter circuit, and
    counter means connected to said electrometer means for counting the number of pulses detected by said ion pulse collecting chamber.

11. The device of claim 10 further including a cabinet surrounding said ion pulse chamber and means for applying a negative potential to the cabinet with respect to the open grid, thereby collecting positively charged free ions or particulates on the cabinet wall.

12. The device of claim 10 further including a cabinet surrounding said ion pulse chamber and means for applying a positive potential to the cabinet with respect to the grid, thereby collecting positively charged free ions or particulates at or near said grid to enhance detection of positively charged radioactive species.

* * * * *